United States Patent
Forstner et al.

(10) Patent No.: US 6,529,065 B2
(45) Date of Patent: Mar. 4, 2003

(54) CIRCUIT CONFIGURATION FOR CONTROLLING THE OPERATING POINT OF A POWER AMPLIFIER

(75) Inventors: Johann-Peter Forstner, Steinhöring (DE); Franz-Xaver Sinnesbichler, Thansau (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/863,955

(22) Filed: May 23, 2001

(65) Prior Publication Data

US 2001/0048347 A1 Dec. 6, 2001

Related U.S. Application Data

(63) Continuation of application No. PCT/EP00/08458, filed on Aug. 30, 2000.

(30) Foreign Application Priority Data

Sep. 23, 1999 (DE) ........................................ 199 45 709

(51) Int. Cl.[7] ................................................ G05F 1/10
(52) U.S. Cl. ...................... 327/538; 327/540; 323/315
(58) Field of Search ............................... 327/538, 540, 327/541, 543; 323/312, 315

(56) References Cited

U.S. PATENT DOCUMENTS

| | | | | |
|---|---|---|---|---|
| 3,617,859 A | * | 11/1971 | Dobkin et al. | 323/280 |
| 4,017,788 A | * | 4/1977 | Stepp et al. | 323/226 |
| 4,399,398 A | * | 8/1983 | Wittlinger | 323/226 |
| 4,879,506 A | * | 11/1989 | Braun | 323/314 |
| 5,323,071 A | * | 6/1994 | Hirayama | 326/112 |
| 5,436,595 A | | 7/1995 | Wholey et al. | 330/296 |
| 5,801,588 A | * | 9/1998 | Nishiyama | 250/214 A |

FOREIGN PATENT DOCUMENTS

| EP | 0 481 117 A1 | 4/1992 |
|---|---|---|
| EP | 0 605 181 A1 | 7/1994 |
| EP | 0 942 524 A2 | 9/1999 |

OTHER PUBLICATIONS

Grebene: "Bipolar and MOS analog integrated circuit design", John Wiley & Sons, Inc., 1984, ISBN 0–471–08529–4, p. 174.
Meinke: "Einführung in die Elektrotechnik höherer Frequenzen" [Introduction to the electrical engineering higher frequencies] in Bauelemente und Stromkreise, vol. 1, Springer Verlag, 1965, pp. 39–47.
Reinschke et al.: "Verfahren zur Rechnergestützten Analyse Linearer Netzwerke" [Process for the computer–assisted analysis of linear networks] Akademie Verlag Berlin, 1976, pp. 18–21.
Spiro: Simulation integrierter Schaltungen durch universelle Rechnerprogramme' [simulation of integrated circuits through universal computer programs], R. Odelbourg Verlag München Wien 1985, p. 110.
Voigt et al.: "Analog Simulation digitaler Logik" Elektronik 17/1994, pp. 86–89.

* cited by examiner

*Primary Examiner*—Terry D. Cunningham
(74) *Attorney, Agent, or Firm*—Laurence A. Greenberg; Werner H. Stemer; Gregory L. Mayback (57) ABSTRACT

A circuit configuration for actuating a power amplifier transistor is described, which is intended to ensure that the power consumption is as low as possible while having a variable output power. Such a circuit is particularly suitable for amplifiers in mobile telephones. In particular, a circuit configuration is described which controls at least two different operating points for at least two different output power ranges. At a first operating point, the quiescent current in the power amplifier transistor is controlled by a first balanced circuit having a temperature-compensating active feedback circuit. At a second operating point, the quiescent current in the power amplifier transistor is controlled by a second balanced circuit, having a second feedback circuit. A third operating range is used in saturation mode, which ensures maximum power efficiency with the maximum output power, although this results in the gain being only partially linear.

11 Claims, 3 Drawing Sheets

CIRCUIT CONFIGURATION FOR CONTROLLING THE OPERATING POINT OF A POWER AMPLIFIER

CROSS-REFERENCE TO RELATED APPLICATION

This application is a continuation of copending International Application No. PCT/EP00/08458, filed Aug. 30, 2000, which designated the United States.

BACKGROUND OF THE INVENTION

Field of the Invention

The invention relates to a circuit configuration for controlling operating points of a power amplifier, in particular such as those used for mobile telephones.

In many applications, linear power amplifiers are operated with a very low quiescent current in order to achieve high efficiency levels, in particular with reduced output power levels. The electrical characteristics of such an amplifier used in the Class AB mode are very heavily dependent on the value of the quiescent current. Within the overall temperature range in which the power amplifier is operated, a constant quiescent current is a precondition for constant and reproducible electrical characteristic data.

If the supply voltages are low, quiescent current control is additionally complicated by the fact that the available voltage range of the amplifier is tightly limited. Exact quiescent current adjustment is problematic, especially in the case of power amplifiers using heterobipolar transistors with high base-emitter forward voltages of, typically, 1.3 V and a supply voltage of 3 V.

Circuit configurations known in the prior art for adjusting the operating point for a power amplifier have the problem that the maximum available voltage range is not sufficient to ensure stable adjustment of the operating point.

If the operating point of the power amplifier is configured for a low quiescent current, then, the efficiency of the power amplifier rises and thus the operating duration of an appliance with a limited energy reservoir increases. On the other hand, the maximum amplification power is limited if the quiescent current is low. In many applications, in particular including mobile radio technology, the amplification power requirements vary, however, so that it is difficult to find an optimum operating point for the amplifier if it is also necessary for the power amplifier to have as high an efficiency level as possible at the same time.

SUMMARY OF THE INVENTION

It is accordingly an object of the invention to provide a circuit configuration for controlling the operating point of a power amplifier that overcomes the above-mentioned disadvantages of the prior art devices of this general type, in which the quiescent current is as constant as possible irrespective of the temperature, thus ensuring an operating point which is as stable as possible even when the quiescent current is low. A further object of the invention is to control the operating point such that the efficiency of the power amplifier is as high as possible even if the amplification power levels vary.

With the foregoing and other objects in view there is provided, in accordance with the invention, a circuit configuration for active control of an operating point of a bipolar transistor in a power amplifier circuit. The circuit configuration contains a current mirror circuit having a first bipolar transistor and a second bipolar transistor. The first bipolar transistor has a control input, a collector and an emitter, and the second bipolar transistor has a control input, a collector and an emitter. A third transistor is connected as a common emitter amplifier circuit and has a control input, a collector and an emitter. The control input of the third transistor is connected to the collector of the second bipolar transistor. A fourth transistor is connected as a common emitter amplifier circuit and has a control input, a collector and an emitter. The control input of the fourth transistor is connected to the collector of the third transistor. A fifth transistor is connected as a common collector circuit and has a control input, a collector and an emitter. The control input of the fifth transistor is connected to the collector of the fourth transistor and the emitter of the fifth transistor is connected to the control input of the second bipolar transistor. A resistor is connected to the collector of the second bipolar transistor, and a voltage source is connected to the resistor and through the resistor the voltage source is connected to the collector of the second bipolar transistor.

The term current mirror circuit should be understood in a wide sense here. The current mirror circuit is formed by two transistors whose control inputs are connected to one another, so that a collector current in one transistor produces a mirrored collector current in the other transistor. Mirrored in this context results in that both the currents behave linearly with respect to one another in the area of interest, in an ideal situation. In this case, with regard to process technology, the two transistors are preferably physically identical, so that the linearity of the two currents with respect to one another is maintained even, for example, in the event of temperature fluctuations. If the two transistors also have the same emitter-base area and if the emitters of the two transistors are at the same potential, then the ratio of the two currents is essentially unity.

The circuit configuration according to the invention allows the current through the collector of the second bipolar transistor to be regulated at a fixed value even in the event of temperature fluctuations. The quiescent current thus also remains constant in the first bipolar transistor, so that the operating point of the bipolar transistor connected in the amplifier circuit is more stable. Control of the current through the collector of the second bipolar transistor is ensured by the active feedback circuit from the collector of the second bipolar transistor to the control input of the second bipolar transistor. The common collector circuit produced with the fifth transistor results in that the output of the feedback circuit also has a low output impedance, so that high output power levels can also be accepted on the first bipolar transistor. Furthermore, the circuit according to the invention has the advantage that the possible voltage range on the first bipolar transistor is wide, since only one diode voltage need be subtracted from the total available voltage.

In one preferred embodiment, the control input of the first bipolar transistor and the control input of the second bipolar transistor are connected to one another via a resistor. The resistor allows the amplifier linearity of the first bipolar transistor to be optimized.

In a further preferred embodiment, the collector of the fifth transistor, and the collector of the fourth transistor are connected to the voltage source via a resistor, and/or the collector of the third transistor is connected to the voltage source via a resistor. This embodiment allows the circuit to be configured with a minimum number of voltage sources. Alternatively, it is possible to provide a separate voltage source with a very high current rating for the collector of the fifth transistor, in order that the fifth transistor can supply a current which is as high as possible to the control input of the first bipolar transistor when the amplifier power level is high.

The transistors which have been mentioned are preferably npn bipolar transistors, and are preferably heterobipolar transistors owing to their superiority in terms of noise response and linearity when the signals to be amplified are analog signals at high frequencies.

In a further preferred embodiment, the control input of the third transistor is connected to the reference ground potential via a resistor, and the control input of the third transistor is connected via a resistor to the collector of the second bipolar transistor, and, furthermore, the control input of the third transistor is preferably connected to the collector of the third transistor via a resistor. The choice of these three resistors allows the operating points of the common collector amplifiers to be set, and thus allows the gain and linearity to be adjusted. Further resistors can also be fit.

The first and second bipolar transistors are advantageously constructed and disposed with respect to one another in such a manner that they have the same thermal characteristics and are largely subject to the same temperature. For a current mirror circuit, it is important for the two bipolar transistors also to behave in the same way in response to thermal changes since, otherwise, the behavior of the current mirror circuit as the current source is adversely affected. It is thus advantageous for the transistors that are part of the current mirror circuit, in particular the first bipolar transistor and the second bipolar transistor to be placed physically as close to one another as possible and, as far as possible, to be produced in the same production process with the same parameters. These two characteristics are best ensured if the two bipolar transistors are produced on the same integrated circuit in the same procedure and are placed as close to one another as possible. The best thermal connection between the two bipolar transistors is achieved, however, if the two bipolar transistors are part of a single bipolar transistor with separate collectors.

Since the circuit according to the invention has bipolar transistors of only one polarity, the circuit can also be produced completely in heterobipolar transistor production processes. The circuit is preferably produced in a GaAs or InGaP process step, so that the transistors used in the circuit configuration according to the invention are heterobipolar transistors. However, the circuit can also be produced, for example, using the SiGe production process or other heterobipolar transistor processes.

In a further preferred embodiment, capacitors are also fit in order to reduce interference signals into the circuit configuration. In particular, capacitors can be fit between each of the control inputs of the second through fifth transistors and the reference-ground potential.

In a further preferred embodiment, a resistor is in each case connected between the reference-ground potential and the emitters of the third and/or fourth transistors. These resistors allow, for example, the linearity of the common emitter amplifier to be adjusted.

The first bipolar transistor is part of one or more amplifier stages in a power amplifier. The amplifier stage is preferably an amplifier in a common emitter circuit having a supply voltage that is connected via a resistor and/or an inductance to the collector of the first bipolar transistor. The emitter of the first bipolar transistor is in this case connected to the reference ground potential, preferably also via a resistor. The signal to be amplified is preferably passed via a coupling capacitor to the control input of the first bipolar transistor.

According to the invention, a circuit configuration for controlling at least two operating points of a bipolar transistor in a power amplifier circuit is furthermore provided. The circuit configuration contains a first current mirror circuit having the first and a second bipolar transistor and is active in a first circuit state, so that a first current through the collector of the second bipolar transistor produces a first current mirror through the collector of the first bipolar transistor. A voltage at the collector of the second bipolar transistor is fed back via an active feedback circuit to the control input of the second bipolar transistor.

A second current mirror circuit is provided and has the first and a third bipolar transistor and is active in a second circuit state so that a second current through the collector of the third bipolar transistor produces a second current mirror through the collector of the bipolar transistor. A voltage at the collector of the third transistor is fed back through a second feedback circuit to the control input of the third bipolar transistor. A switch circuit for switching between the first and the second circuit state is provided.

In the configuration according to the invention, the two operating points of the first bipolar transistor are each governed by one of the two current mirror circuits. The relevant current mirror circuit is in this case the active current mirror circuit. The circuit configuration according to the invention thus makes it possible to use only one switch to operate the first bipolar transistor, by switching to at least two different operating points.

The position of the operating points in the family of characteristics of the first bipolar transistor can in this case be adjusted essentially by the resistances of the resistors and the transistor parameters. Therefore, the circuit according to the invention can be constructed such that the quiescent current and quiescent voltage for a power amplification application with a variable output power level can be switched to optimum values with regard to the power consumption. The power efficiency can thus be increased significantly, even for linear amplification.

In one preferred embodiment, the collector of the second bipolar transistor is electrically connected to a voltage source via a resistor. The first current through the collector of the second bipolar transistor, and thus through the first bipolar transistor, is thus defined in the first circuit state.

In one preferred embodiment, the second feedback circuit contains only a line with or without a non-reactive resistor. Furthermore, the collector of the third bipolar transistor is preferably connected to a voltage source via a resistor. The second current through the collector of the third bipolar transistor is essentially defined in this way. The current through the first bipolar transistor when small AC signals are applied to the input of the power amplifier is thus also defined in the second circuit state.

In one preferred embodiment, the active feedback circuit has a voltage amplifier. The voltage amplifier results in that any voltage change (caused by a change in the first current) at the collector of the second bipolar transistor is amplified and is fed back to the control line of the second bipolar transistor, thus counteracting the change in the first current. Therefore, the first current is also stabilized in the event of temperature changes. The active feedback circuit preferably has two series-connected common emitter amplifiers since these amplify an input voltage in a simple manner and, when connected in series, maintain the polarity of an input signal.

The active feedback circuit preferably has a low-impedance output stage, so that the control input of the first bipolar transistor can be driven with a low impedance even when the output power levels are high.

The output stage of the active feedback circuit preferably has a high impedance below a minimum threshold voltage difference between the collector voltage and the control input voltage of the second bipolar transistor. This characteristic allows the active feedback circuit to be deactivated in a simple manner.

Deactivation of the active feedback loop is necessary, for example, if one wishes to deactivate the first current circuit in order to drive the first bipolar transistor using the second current mirror circuit. The output stage of the active feedback circuit thus preferably has a common collector circuit which, in linear operation, has a low-impedance output, but has a very high-impedance output when the voltage between the emitter and the control input is less than the diode voltage of the transistor.

The first current mirror circuit is preferably configured as the circuit configuration previously mentioned. Such a circuit provides the already described advantages of temperature-stabilized quiescent-current operation in the first bipolar transistor, and represents a low-impedance voltage supply for the control input of the first bipolar transistor which is to be supplied by it. Furthermore, this type of active feedback provides a way for deactivating the active feedback circuit by the voltage between the control input and the collector of the second bipolar transistor being set, switched from the exterior, to be less than the threshold voltage difference.

The control input of the third bipolar transistor is preferably connected via a resistor to the first bipolar transistor and to the second bipolar transistor, with the resistor having a considerably greater resistance than the low output impedance of the active feedback circuit in the non-high-impedance state. In the second circuit state, the resistor essentially governs the output impedance with which the DC control input of the first bipolar transistor is supplied with voltage. The resistor preferably has a considerably greater resistance than the output impedance of the activated active feedback circuit, and a considerably lower resistance than the output impedance of the deactivated active feedback circuit.

The switch circuit is preferably of such a type that, in the second circuit state, it sets the collector voltage of the second bipolar transistor to a threshold voltage value which is less than the collector voltage in the first circuit state. The threshold voltage value is preferably so low that, in the second circuit state, the voltage between the collector and control line of the bipolar transistor is less than the threshold voltage difference. Such a switch circuit allows the active feedback circuit to be deactivated, so that the quiescent current in the first bipolar transistor is controlled by the second current mirror circuit.

The switch circuit preferably has a transistor disposed in parallel with the second bipolar transistor, with the collector of the transistor being connected, preferably via a resistor, to the collector of the second bipolar transistor, and with the transistor being switched off in the first circuit state and being switched on in the second circuit state by applying a control voltage to the control input. The resistor in this case allows the threshold voltage value to be adjusted.

The DC control input of the first bipolar transistor, which has a comparatively high impedance in the second circuit state, furthermore results in that it is possible to operate with a particularly high power efficiency in a third mode. The high-impedance DC control input results in that it is possible, when the AC input signals are high at the same time, for a current to be drawn at the control input of the first bipolar transistor that is so high that the control input of the first bipolar transistor falls to a lower value than when the AC signals are small. The drop in the control input voltage to the first bipolar transistor results in that the active feedback loop becomes active once again, so that the low voltage at the first bipolar transistor is supplied with a low impedance. The first bipolar transistor can thus produce very powerful signals, even if they are also non-linear. This type of amplification is used in particular for the mobile radio transmitters in the AMPS standard.

The control input of the second bipolar transistor is preferably connected via a resistor both to the control input of the first bipolar transistor and to the control input of the third bipolar transistor. The resistor, whose resistance is preferably the same as that of, is multiplied by the ratio of the emitter-base areas of the bipolar transistor and the bipolar transistor. It is preferably used to ensure that the voltage drop (produced by the base current) across the resistor is approximately of the same magnitude as the voltage drop (produced by the base current) across the resistor. This measure improves, inter alia, the linearity of the channel currents in the first and second bipolar transistors and when the first current mirror circuit is active.

The control input of the first bipolar transistor is preferably connected via a resistor both to the control input of the second bipolar transistor and to the control input of the third bipolar transistor, with the resistance of the resistor being less, preferably more than four times less, than the resistance of the resistor. The resistor allows the linearity of the power amplification of the bipolar transistor to be optimized for AC input signals.

The first bipolar transistor is preferably part of a power amplifier stage having an amplifier input that is connected via a coupling capacitance to the control input of the first bipolar transistor. This allows AC input signals and, in particular, radio-frequency AC signals to be amplified linearly with regard to voltage and current. The maximum output power of the first bipolar transistor is in this case governed essentially by the characteristic data of the first bipolar transistor and by the maximum current available in the control input. The amplifier stage is in this case preferably a common emitter amplifier.

The first, the second and the third bipolar transistor are preferably constructed and disposed with respect to one another in such a manner that they have the same thermal characteristics. This measure results in that the transistors which are relevant for the current mirror have largely identical characteristics at the relevant temperatures, except for an area factor that is governed by the base-emitter areas. In particular, it is advantageous if, for this purpose, the first, the second and the third bipolar transistor are disposed in the immediate vicinity of one another in an integrated circuit.

Furthermore, the first, second and third bipolar transistors are heterobipolar transistors, in particular from a GaAs, InGaP or SiGe heterobipolar transistor process. Heterobipolar transistors allow very fast, linear, low-noise amplifier circuits to be constructed as are required in particular for mobile telephone technology. Since the power amplifier is preferably equipped with a heterobipolar transistor, it is advantageous for the operation of the current mirror circuits for the corresponding current mirror circuit transistors to be heterobipolar transistors as well.

Furthermore, the circuit configuration according to the invention is preferably used for mobile telephones, where it is used in particular for amplification of the signals to be transmitted, where the aim is to amplify signals in the Gigahertz frequency range to power levels of more than 30 dBm with high power efficiency.

Other features which are considered as characteristic for the invention are set forth in the appended claims.

Although the invention is illustrated and described herein as embodied in a circuit configuration for controlling the operating point of a power amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a circuit configuration for adjusting an operating point for a power amplifier according to the prior art. The circuit configuration has the problem in that the maximum available voltage range is not sufficient to ensure stable adjustment of the operating point. The circuit configuration shown in FIG. 1 for operating point adjustment has a voltage source that produces a voltage U. The voltage source is connected via a resistor RAP both to a control input of a first impedance converter TVI and to a first transistor TAP1, which is operated as a diode. The first transistor TAP1 is connected to a first reference-ground potential GND via a second transistor TAP2, which is likewise operated as a diode. If the voltage source produces an output voltage U of 3 V, then 1.3 V is dropped across each of the two transistors TAP1 and TAP2, since they are both heterobipolar transistors. Therefore, the maximum that can now be dropped across the resistor RAP is 0.4 V. A base-emitter voltage UBE varies by about 2 mV per K. Therefore, the voltage range is often inadequate to ensure stable operating point adjustment.

Figure 2:
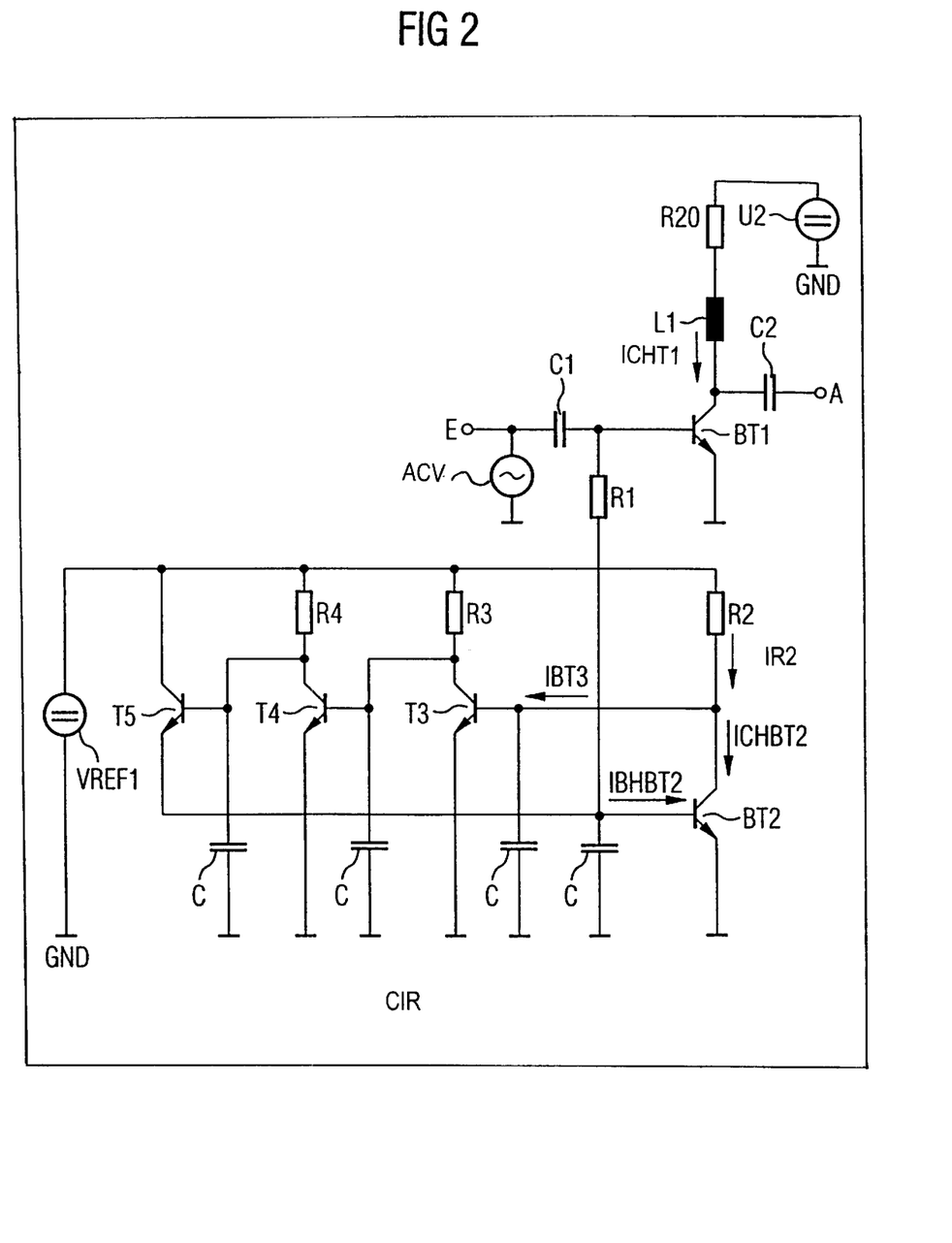
FIG. 2 is a circuit diagram of an embodiment of the circuit configuration for active control of the operating point of a power amplifier according to the invention.

The configuration according to the invention is shown in FIG. 2. The circuit configuration provides active control of the operating point of a first bipolar transistor BT1 in a power amplifier circuit and the first bipolar transistor BT1 which, together with a second bipolar transistor BT2, forms a current mirror circuit in the wide sense. An input signal to be amplified is applied to a terminal E, and is passed via a capacitance C1 to a control input of the first bipolar transistor BT1. The signal amplified by the first bipolar transistor BT1 can be tapped off at an output terminal A, which is connected via a capacitance C2 to a collector of the first bipolar transistor BT1. The collector of the first bipolar transistor BT1 is also connected via an inductance L1, and preferably via a resistor R20 connected in series with it, to a voltage source which produces a voltage U2. An emitter of the first bipolar transistor BT1 is at a reference ground potential GND. A resistor R1 connects the two control inputs of the bipolar transistors BT1 and BT2. A control input of the second bipolar transistor BT2 is also connected via a capacitance C to the reference ground potential GND. A voltage source VREF1 that produces an output voltage is connected to the reference ground potential GND and through a second resistor R2 to a collector of the second bipolar transistor BT2. The voltage source VREF1 is connected through a third resistor R3 to a collector of a third transistor T3, through a fourth resistor R4 to a collector of a fourth transistor T4 and, without a resistor, to a collector of a fifth transistor T5. A control input of the third transistor T3 is connected to the collector of the second bipolar transistor BT2 and through a capacitance C to the reference ground potential GND. Emitter connections of the third transistor T3 and of the fourth transistor T4 are each connected to the reference ground potential GND while, in contrast, an emitter connection of the fifth transistor T5 is connected to the control input of the second bipolar transistor BT2. A control input of the fourth transistor T4 is connected both to the collector of the third transistor T3 and, via the capacitance C, to the reference ground potential GND. In a corresponding manner, a control input of the fifth transistor T5 is also connected both to the collector of the fourth transistor T4 and, via a capacitance C, to the reference ground potential GND. The emitter of the second bipolar transistor BT2 is connected to the reference ground potential GND. The input terminal E is connected not only to the capacitance C1 but also to an AC voltage source ACV.

The transistors BT1, BT2, T3, T4, T5 in the circuit configuration shown in FIG. 2 are in the form of npn transistors and, preferably, are in the form of heterobipolar transistors. The standard transistor type simplifies the production process.

The first and the second bipolar transistor BT1 and BT2 are preferably constructed and disposed with respect to one another in such a manner that they have the same thermal characteristics. This can be achieved, for example, by the first and the second bipolar transistors BT1, BT2 being disposed in the immediate vicinity of one another in an integrated circuit CIR. In addition, the second bipolar transistor BT2 may be part of the first bipolar transistor BT1. For example, the second bipolar transistor BT2 may, as a reference transistor, be a finger of the first bipolar transistor BT1, which is in the form of an output stage transistor. The bipolar transistors are preferably produced using an InGaP heterobipolar transistor process.

The principle of operation of the circuit configuration shown in FIG. 2 will be described in the following text. On the assumption that the temperature is increasing, a collector current ICHBT2 of the second bipolar transistor BT2 also increases. A current IR2 through the second resistor R2 thus also increases.

Any increase in the collector current ICHBT2 in the second bipolar transistor BT2 results in that the collector-emitter voltage in the second bipolar transistor BT2 falls. The base-emitter voltage across the third transistor T3 thus also falls, as does the base current IBT3 of the third transistor T3. This in turn results in that the collector-emitter voltage across the third transistor T3 rises, while, in contrast, the collector-emitter voltage across the fourth transistor T4 falls. The base-emitter voltage across the fifth transistor T5 thus also falls, as well as the base-emitter voltage across the second bipolar transistor BT2 and the base current IBHBT2 of the second bipolar transistor BT2. This effectively counteracts the increase in the collector current ICHBT2 of the second bipolar transistor BT2 caused by the initially assumed temperature increase. The temperature increase can thus be compensated for. The same also applies, in a corresponding manner, to a temperature reduction.

The third and the fourth transistors T3 and T4 in the two common emitter circuits are respectively used to increase the voltage range and to produce a 180° phase shift. The fifth transistor T5, which is disposed in a common collector circuit, is used as an impedance converter and has a low-impedance output.

The area required for the second to fifth transistors BT2, T3, T4, T5 can be kept small since these transistors are used only for controlling the first bipolar transistor BT1.

The capacitances C act as filters in order to avoid interference caused by radio-frequency signal components.

The third transistor T3, which is in a common emitter circuit, is used as an amplifier and produces an output signal phase-shifted through 180° with respect to its input signal. A corresponding statement applies to the fourth transistor T4. The fifth transistor T5, which is a common collector circuit, does not produce any phase shift between its input and output signals. The fifth transistor T5 amplifies its input signal just as little as this.

The collector current ICHBT1 of the first bipolar transistor BT1 is given, to a first approximation, by the following equation:

$$ICHBT1 = k \times ICHBT2 = k \times 1.7 \text{ V}/R2, \quad (1)$$

where k is a ratio of the emitter/base areas of the first bipolar transistor BT1 and the second bipolar transistor BT2. The voltage of 1.7 V results from the difference between the supply voltage VREF1 of 3 V and a diode voltage drop of 1.3 V across the heterobipolar transistors.

Figure 1:
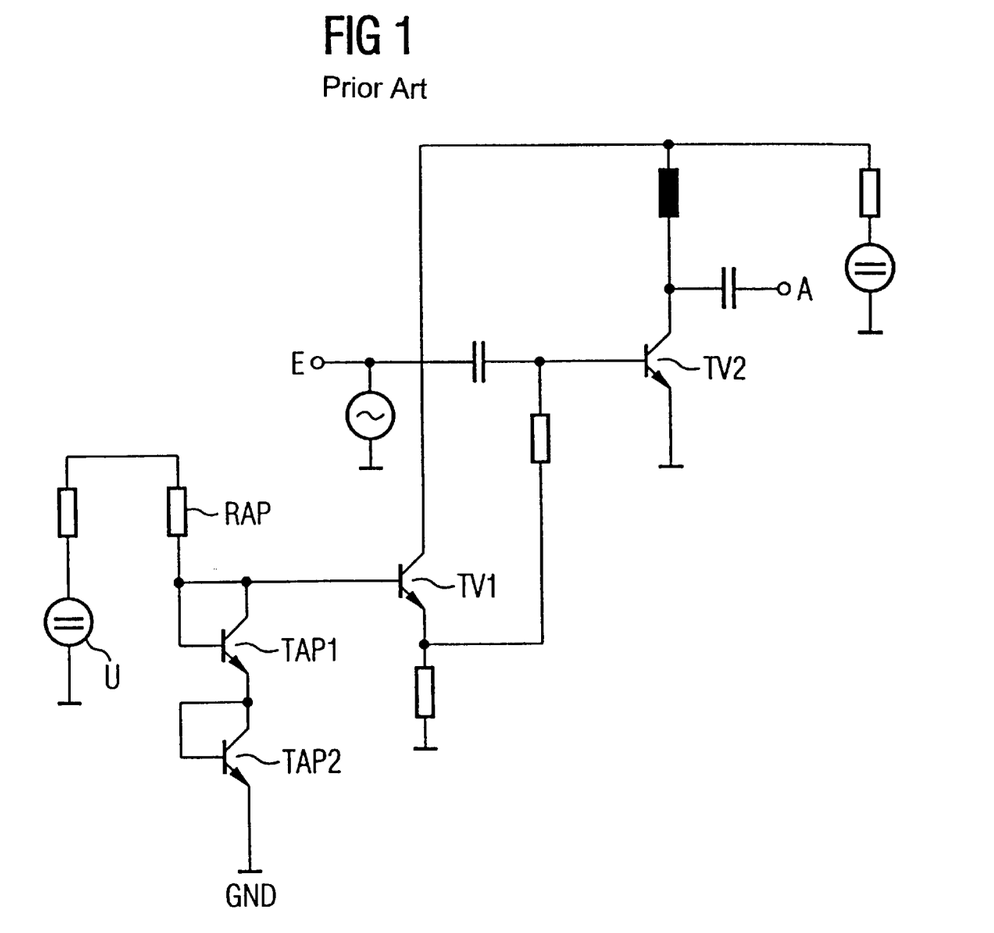
FIG. 1 is a circuit diagram of a known circuit configuration for performing an operating point adjustment.

The circuit configuration according to the invention shown in FIG. 2 advantageously allows the voltage which is dropped across the second resistor R2 to be increased in comparison to the circuit configuration shown in FIG. 1 and the voltage dropped across the resistor RAP. This also allows a greater voltage range at the power amplifier input of the first bipolar transistor BT1 for signal amplification, and better temperature compensation. If, for example, the voltage source VREF1 produces a voltage of 3 V, then the circuit shown in FIG. 2 allows a voltage of about 1.7 V to be dropped across the second resistor R2, which results from the difference between the voltage (i.e. 3 V) produced by the voltage source VREF1 and the collector-emitter voltage amounting to about 1.3 V to 1.4 V dropped across the second heterobipolar transistor BT2. In the circuit configuration shown in FIG. 1, only a maximum of 0.4 V is dropped across the resistor RAP.

The embodiment according to the invention shown in FIG. 2 may be regarded as a current mirror circuit with the two bipolar transistors BT1 and BT2, with the current ICHBT2 resulting in occurrence in accordance with equation (1) being applied to the bipolar transistor BT1. An active feedback circuit is in this case fit for stabilization of the current ICHBT2 in FIG. 2. The active feedback circuit feeds back voltage fluctuations (caused by current fluctuations) at the collector of the second bipolar transistor BT2 in amplified form to the control input of the bipolar transistor BT2, thus counteracting the current fluctuations. The feedback circuit in this embodiment essentially contains the two series-connected common emitter circuits in this case, which act as voltage amplifiers, and a common collector circuit which acts as an output stage.

Figure 3:
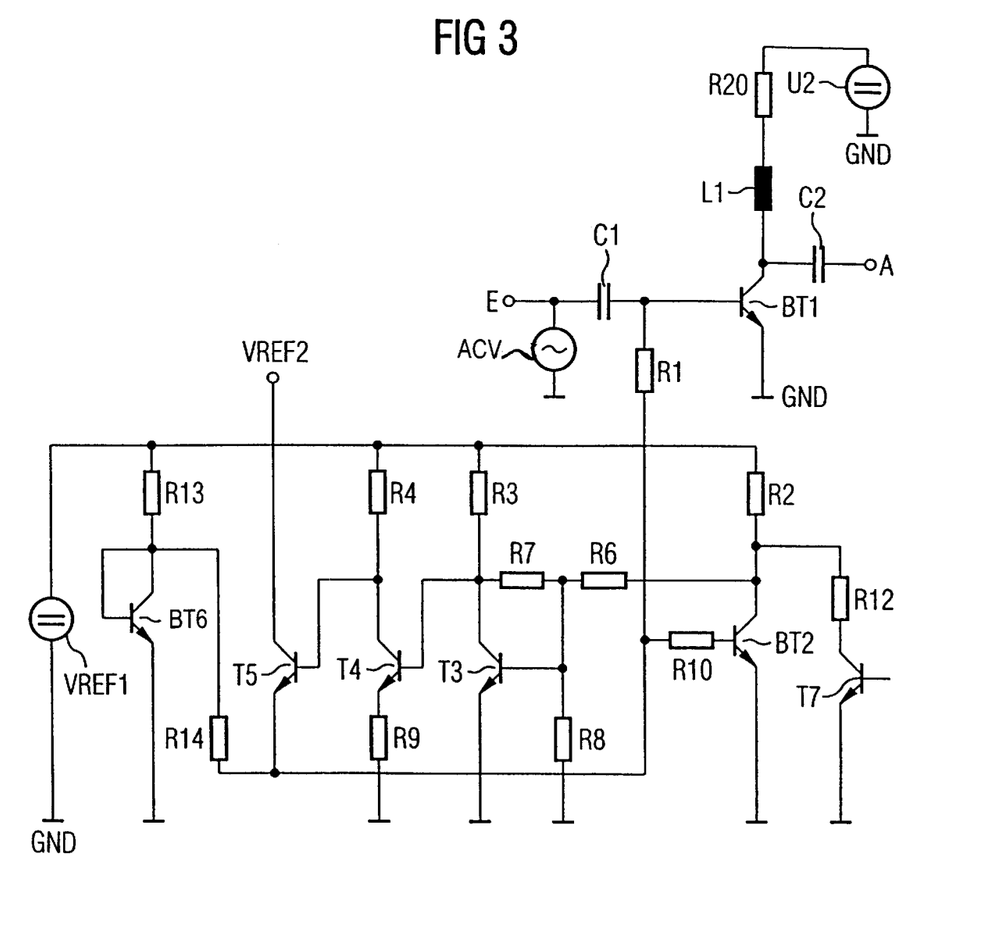
FIG. 3 is a circuit diagram of an embodiment of the circuit configuration for controlling at least two operating points of a bipolar transistor in a power amplifier circuit.

The embodiment of the circuit configuration according to the invention shown in FIG. 3 for controlling at least two operating points of the bipolar transistor BT1 in the power amplifier circuit likewise has the first bipolar transistor BT1 which, together with the second bipolar transistor BT2, forms a first current mirror circuit in the wider sense. The AC input signal to be amplified is applied to the terminal E and is passed via the capacitance C1 to the control input of the first bipolar transistor BT1. The signal amplified by the first bipolar transistor BT1 can be tapped off at the output terminal A, which is connected via the capacitance C2 to the collector of the first bipolar transistor BT1. The collector of the first bipolar transistor BT1 is also connected via the inductance L1 and the resistor R20 connected in series with it to the voltage source that produces a voltage U2. The emitter of the first bipolar transistor BT1 is at the reference ground potential GND. The control input of the first bipolar transistor BT1 and the control input of the second bipolar transistor BT2 are connected via the series-connected resistors R1 and R10.

Furthermore, the voltage source VREF1 that produces the output voltage is connected via the second resistor R2 to the collector of the second bipolar transistor BT2, via the third resistor R3 to the collector of the third transistor T3, via the fourth resistor R4 to the collector of the fourth transistor T4, and via a resistor R13 to a collector of a bipolar transistor BT6. The control input of the third transistor T3 is connected through a resistor R6 to the collector of the second bipolar transistor BT2, and via a resistor R7 to the collector of the third transistor T3, and via a resistor R8 to the reference ground potential GND. The emitter of the third transistor T3 is connected directly to the reference ground potential GND, and the emitter of the fourth transistor T4 is connected to the reference ground potential GND via a resistor R9. The emitter of the fifth transistor T5 is, in contrast, connected via the resistor R10 to the control input of the second bipolar transistor BT2. The control input of the fourth transistor T4 is connected to the collector of the third transistor T3. In a corresponding manner, the control input of the fifth transistor T5 is also connected to the collector of the fourth transistor T4. The emitter of the second bipolar transistor BT2 is connected to the reference ground potential GND. The collector of the fifth transistor is preferably connected to a second voltage source VREF2 and not to the voltage source VREF1, in order to avoid loading the voltage source VREF1 with the possibly high currents flowing through the fifth transistor T5. Furthermore, a control input of the sixth bipolar transistor BT6 is connected to the collector of the sixth bipolar transistor BT6, and is preferably short-circuited. The control input of the sixth bipolar transistor BT6 is connected to the control input of the first bipolar transistor BT1 via the resistors R14 and R1. The emitter of the sixth bipolar transistor BT6 is connected to the reference ground potential. The input terminal E is connected not only to the capacitance C1 but also to the AC voltage source ACV.

For a switching operation, a collector of a seventh transistor T7 is connected by a resistor R12 to the collector of the bipolar transistor BT2. An emitter of the transistor T7 is connected to the reference ground potential GND. A channel of the seventh transistor T7 can be switched either on or off by a logic drive to a control input of the seventh transistor T7.

The principle of operation of the circuit configuration according to the invention is now described. When the power amplifier is switched to a first circuit state, then the transistor T7 is driven from the exterior such that it is switched off. In the first state, the first current mirror circuit with the bipolar transistors BT1 and BT2 is active, so that the current in the bipolar transistor BT1 is governed essentially by the current in the bipolar transistor BT2, preferably in accordance with equation (1). The current in the second bipolar transistor BT2 is in this case stabilized by an active feedback circuit, which amplifies any voltage fluctuations at the collector of the bipolar transistor BT2 before passing them to the control input of the bipolar transistor BT2. Stabilization of the current which, in particular, also regulates out current fluctuations in response to temperature fluctuations, also results in stabilization of the quiescent current, and hence of the operating point in the first bipolar transistor BT1.

The active feedback circuit in the embodiment as shown in FIG. 2 essentially contains two series-connected common emitter voltage amplifiers formed from the transistors T3, T4 and the common collector circuit formed from the transistor T5. The latter is used as an impedance converter to produce a low output impedance for the active feedback circuit. The low output impedance of the feedback circuit is required to ensure that the first bipolar transistor BT1 is supplied with the necessary current at the control input even when the output power is high. This ensures largely linear signal amplification even when the output power of the bipolar transistor BT1 is high. If one wishes to ensure largely linear amplification when the output power is high, then the operating point of the bipolar transistor BT1 is preferably set to a sufficiently high quiescent current level.

The low output impedance of the active feedback circuit furthermore ensures that the bipolar transistor BT2 and not the bipolar transistor BT6 is active as the current mirror circuit, since the output impedance of the sixth bipolar transistor BT6 is considerably higher than that of the active feedback circuit. The output impedance at the control input of the bipolar transistor BT1 is in this case preferably governed essentially by the resistor R14, since the resistance of the resistor R1 is several times less than that of the resistor R14.

In a second circuit state, the transistor T7 is driven from the exterior such that it is switched on, and the collector voltage of the second bipolar transistor BT2 is drawn down to a lower value. In the preferred embodiment, the resistor R12 is in this case chosen such that the collector voltage of the bipolar transistor BT2 falls below the threshold voltage value, so that a threshold voltage difference Vthr between the control input and the collector of the bipolar transistor BT2 is undershot. In consequence, an output stage of the active feedback circuit, which is preferably in the form of a common emitter circuit, has a considerably higher impedance than that of the resistor R14. The active feedback circuit is thus essentially deactivated.

If the active feedback circuit is deactivated, then the voltage supply to the control input of the first bipolar transistor BT1 is governed essentially by a second current mirror circuit formed of the bipolar transistors BT6 and BT1. The output impedance of this current supply, which is governed essentially by the resistor R14, is preferably considerably greater than the output impedance produced by the active feedback circuit. The limited current rating results in that the first bipolar transistor BT1 can amplify linearly only signals with a limited output power. In this case, the operating point of the first bipolar transistor BT1 is preferably set to a low quiescent current level. This circuit state is thus preferably activated when the bipolar transistor BT1 is required to produce linear amplification with only a moderate output power level.

If linear amplification is not required, for example as in the AMPS mode in the transmission standards, then the second circuit state offers a third operating mode with a very low quiescent current and very high output power level. If, in the second circuit state, AC signals having a very high amplitude are passed to the amplifier input, then rectification effects in the bipolar transistor BT1 lead to an increased current being drawn at the control input of the bipolar transistor BT1. The increased current is drawn from the collector of the bipolar transistor BTG via the high-resistance resistor R14. In consequence, the voltage. downstream from the resistor R14 falls and, in particular, at the output of the active feedback circuit, which is still deactivated. The voltage drop downstream from the resistor R14 now results in that the threshold voltage difference Vthr between the control input and the collector of the bipolar transistor BT2 is undershot once again, so that the active feedback circuit, with its low output impedance, becomes active once again. Seen from the control input of the first bipolar transistor BT1, the control input of the first bipolar transistor BT1 is thus supplied, with a lower impedance, with a voltage which is governed by the interaction of the voltages at the control inputs of the second bipolar transistor BT2 and of the sixth bipolar transistor BT6. The lower output impedance thus once again allows greater power to be produced at the output of the bipolar transistor BT1. If there is no need for amplification linearity, then signals that have been overdriven in this way can be produced with very high power efficiency for a very high output power level.

The precise values of the resistors in the circuits in FIG. 1 and FIG. 2 depend to a considerable extent on the application and the characteristics of the transistors used. The circuit configurations shown in FIG. 2 and FIG. 3 are preferably suitable for circuits for the transmitter amplifiers of mobile telephones in the Gigahertz frequency band. For this application, the output power levels are preferably switched between about 16 dBm and 30 dBm. Accordingly, the resistor R1 is preferably chosen to have a resistance of about one quarter of that of the resistor R14 in order to allow a base current that is approximately four times as great to be produced for the first bipolar transistor BT1 in the first circuit state. A typical value for the resistor R14 is preferably about 100 ohm.

The circuits in this embodiment are preferably supplied with a voltage of about 3 V. The circuits are preferably produced using an InGaP process, so that the transistors are preferably heterobipolar transistors with a diode voltage range of about 1.3 V. The circuits are preferably operated in the CDMA high mode, the CDMA low mode and in the AMPS mode, with the CDMA high mode corresponding to the first circuit state for high output power levels from the power amplifier.

The resistance values for the circuit shown in FIG. 3 depend on the characteristics of the transistors and the desired power amplifier behavior. Once the requirements have been defined, then the optimum resistance values can be determined and optimized by a person skilled in the art. It is also possible for the circuit response to be improved further by additional resistors, inserted capacitors and inductances in the circuit according to the invention. Provided they reflect the fundamental concept of this circuit, these variations are included in the scope of the invention.

We claim:

1. A circuit configuration for active control of an operating point of a first bipolar transistor in a power amplifier circuit, comprising:

a current mirror circuit having the first bipolar transistor and a second bipolar transistor, the first bipolar transistor having a control input, a collector and an emitter, said second bipolar transistor having a control input, a collector and an emitter, the control input of the first bipolar transistor and said control input of said second bipolar transistor being connected to one another for causing a collector current in one of the first bipolar transistor and said second bipolar transistor to produce a mirror collector current in the other of the first bipolar transistor and said second bipolar transistor;

a third transistor provided in a common emitter amplifier circuit and having a control input, a collector and an emitter, said control input of said third transistor connected to said collector of said second bipolar transistor;

a fourth transistor provided in the common emitter amplifier circuit and having a control input, a collector and an emitter, said control input of said fourth transistor connected to said collector of said third transistor;

a fifth transistor provided in a common collector circuit and having a control input, a collector and an emitter, said control input of said fifth transistor connected to said collector of said fourth transistor and said emitter of said fifth transistor connected to said control input of said second bipolar transistor;

a resistor connected to said collector of said second bipolar transistor; and a voltage source connected to said resistor and through said resistor to said collector of said second bipolar transistor.

2. The circuit configuration according to claim 1, including a further resistor connected between said control input of said first bipolar transistor and said control input of said second bipolar transistor.

3. The circuit configuration according to claim 1, wherein said collector of said fifth transistor is connected to said voltage source;

including a second resistor connected between said collector of said fourth transistor and said voltage source; and including a third resistor connected between said collector of said third transistor and said voltage source.

4. The circuit configuration according to claim 1, wherein said first bipolar transistor, said second bipolar transistor, said third transistor, said fourth transistor and said fifth transistor are selected from the group consisting of npn bipolar transistors and heterobipolar transistors.

5. The circuit configuration according to claim 3, including:

a reference ground potential plane;

a fourth resistor connected between said control input of said third transistor and said reference ground potential plane;

a fifth transistor connected between said collector of said second bipolar transistor and said control input of said third transistor; and a sixth resistor connected between said collector of said third transistor and said control input of said third transistor.

6. The circuit configuration according to claim 1, wherein said first bipolar transistor and said second bipolar transistor are constructed and disposed with respect to one another in such a manner that they have equivalent thermal characteristics.

7. The circuit configuration according to claim 1, including an integrated circuit, and said first bipolar transistor and said second bipolar transistor being disposed in an immediate vicinity of one another in said integrated circuit.

8. The circuit configuration according to claim 1, wherein said second bipolar transistor is part of said first bipolar transistor.

9. The circuit configuration according to claim 1, wherein said first bipolar transistor and said second bipolar transistor are heterobipolar transistors formed from one of a GaAs, an InGaP and a SiGe heterobipolar transistor manufacturing process.

10. The circuit configuration according to claim 1, including a reference ground potential plane; and a plurality of capacitors, one of said capacitors being in each case connected between said reference ground potential plane and said control input of one of said second bipolar transistor, said third transistor, said fourth transistor and said fifth transistor.

11. The circuit configuration according to claim 3, including:

a reference ground potential plane;

a fourth resistor connected between said reference-ground potential and said emitter of said third transistor; and a fifth resistor connected between said reference-ground potential and said emitter of said fourth transistor.

* * * * *